(12) United States Patent
Park et al.

(10) Patent No.: US 11,320,941 B2
(45) Date of Patent: May 3, 2022

(54) SENSING DEVICE WITH FINGERPRINT SENSOR

(71) Applicant: Samsung Electro-Mechanics Co., Ltd., Suwon-si (KR)

(72) Inventors: Jung Eui Park, Suwon-si (KR); Joo Yul Ko, Suwon-si (KR); Ho Kwon Yoon, Suwon-si (KR); Woo Young Choi, Suwon-si (KR); Soo Woong Lee, Suwon-si (KR); Joo Hyoung Lee, Suwon-si (KR); Ju Yong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 132 days.

(21) Appl. No.: 16/798,914

(22) Filed: Feb. 24, 2020

(65) Prior Publication Data

US 2021/0004097 A1 Jan. 7, 2021

(30) Foreign Application Priority Data

Jul. 3, 2019 (KR) .................. 10-2019-0080122
Oct. 11, 2019 (KR) .................. 10-2019-0126404

(51) Int. Cl.
*G06F 3/044* (2006.01)
*H03K 17/96* (2006.01)
*H03H 17/06* (2006.01)

(52) U.S. Cl.
CPC ......... *G06F 3/044* (2013.01); *H03H 17/0671* (2013.01); *H03K 17/962* (2013.01); *H03K 2217/960745* (2013.01); *H03K 2217/960755* (2013.01)

(58) Field of Classification Search
CPC combination set(s) only.
See application file for complete search history.

(56) References Cited

U.S. PATENT DOCUMENTS

| 6,647,133 | B1 * | 11/2003 | Morita | G06K 9/00899 |
|---|---|---|---|---|
| | | | | 382/124 |
| 2013/0106735 | A1 * | 5/2013 | Lee | G06F 3/0416 |
| | | | | 345/173 |
| 2013/0120053 | A1 * | 5/2013 | Mei | G06F 3/044 |
| | | | | 327/517 |
| 2013/0162565 | A1 * | 6/2013 | Kim | G06F 3/0446 |
| | | | | 345/173 |

(Continued)

FOREIGN PATENT DOCUMENTS

| JP | 2010-3187 A | 1/2010 |
|---|---|---|
| JP | 2012-168747 A | 9/2012 |

(Continued)

*Primary Examiner* — Robin J Mishler
(74) *Attorney, Agent, or Firm* — NSIP Law

(57) ABSTRACT

A sensing device with a fingerprint sensor is provided. The sensing device includes a touch input pattern included in the fingerprint sensor, an oscillation circuit connected to the touch input pattern and configured to change a capacitance of the oscillation circuit when a touch occurrence is sensed by the touch input pattern and generate an oscillation signal based on the change in the capacitance, and an operation detection circuit configured to detect a touch occurrence based on a frequency included in the oscillation signal input from the oscillation circuit and generate a detection signal.

20 Claims, 11 Drawing Sheets

(56) References Cited

U.S. PATENT DOCUMENTS

| | | |
|---|---|---|
| 2015/0130649 A1 | 5/2015 | Itakura et al. |
| 2018/0093695 A1 | 4/2018 | Hattori et al. |
| 2018/0120364 A1* | 5/2018 | Lee ........................ G01R 23/10 |

FOREIGN PATENT DOCUMENTS

| | | |
|---|---|---|
| JP | 2015-95865 A | 5/2015 |
| KR | 2002-0077836 A | 10/2002 |
| KR | 10-2009-0120709 A | 11/2009 |
| KR | 10-2011-0087004 A | 8/2011 |
| KR | 10-2011-0087014 A | 8/2011 |
| KR | 10-2016-0098030 A | 8/2016 |
| KR | 10-2018-0046833 A | 5/2018 |

* cited by examiner

Example in which there is no touch

Example in which there is touch

SENSING DEVICE WITH FINGERPRINT SENSOR

CROSS-REFERENCE TO RELATED APPLICATIONS

This application claims the benefit under 35 USC 119(a) of Korean Patent Application No. 10-2019-0080122 filed on Jul. 3, 2019 and Korean Patent Application No. 10-2019-0126404 filed on Oct. 11, 2019 in the Korean Intellectual Property Office, the entire disclosures of which are incorporated herein by reference for all purposes.

BACKGROUND

1. Field

The present disclosure relates to a sensing device with a fingerprint sensor.

2. Description of Related Art

Typically, it is beneficial for wearable devices to have a thinner, simpler and cleaner design. Accordingly, existing mechanical switches are being utilized less, in view of the implementation of dustproof and waterproof technologies and the development of models with a smooth design and a sense of design unity.

Currently, technologies such as a touch on metal (ToM) technology for touching an upper portion of a metal, a capacitor sensing technique that utilizes a touch panel, a micro-electro-mechanical-system (MEMS), and a micro strain gauge are being developed. Furthermore, the force touch function is being developed.

With regard to existing mechanical switches, a relatively large amount of size and space may be needed internally to implement switching functions, and further, and the design may not be neat due to the appearance of external protrusions or a structure that is not integrated with an external case, and a large space may be needed.

Additionally, there is a risk of electric shocks if direct contact is made with the electrically connected mechanical switch, and dust-proofing and waterproofing may be difficult to implement in view of to the structure of the mechanical switch.

Additionally, it may be beneficial to implement a touch input to be sensed with an existing fingerprint sensor.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In a general aspect, a sensing device includes a sensor, a touch input pattern included in the sensor, an oscillation circuit connected to the touch input pattern, and configured to change a capacitance of the oscillation circuit when a touch occurrence is sensed by the touch input pattern, and generate an oscillation signal based on the change in the capacitance, and a detection circuit configured to detect the touch occurrence based on a frequency included in the oscillation signal and generate a detection signal.

The oscillation signal may be input to the operation detection circuit from the oscillation circuit.

The sensor may be a fingerprint sensor.

The touch input pattern may be a conductor pattern that includes a portion of a plurality of fingerprint recognition patterns included in the fingerprint sensor.

The touch input pattern may be a conductor pattern that is disposed separately from a plurality of fingerprint recognition patterns included in the fingerprint sensor.

The oscillation circuit may include an inductance circuit including a coil element disposed on an external surface of the fingerprint sensor; and a capacitance circuit disposed on the external surface of the fingerprint sensor, and may include a capacitor device spaced apart from the coil element.

The capacitance circuit may include a capacitance that is varied by the touch occurrence that is sensed by the touch input pattern.

The oscillation circuit may include an inductance circuit including a coil element embedded in the fingerprint sensor; and a capacitance circuit including a capacitor device disposed on an external surface of the fingerprint sensor.

The capacitance circuit may include a capacitance that is varied by the touch occurrence that is sensed by the touch input pattern.

The operation detection circuit may include a frequency digital converter configured to convert the generated oscillation signal into a count value; and a touch detection circuit configured to detect the touch occurrence based on the count value input from the frequency digital converter, and generate a detection signal.

The frequency digital converter may be configured to generate the count value by counting a reference clock signal based on the oscillation signal.

The frequency digital converter may be configured to divide a reference frequency signal by using a reference frequency division ratio to generate a divided reference clock signal, divide the generated oscillation signal by using a sensing frequency division ratio, and count the divided reference clock signal by using the divided oscillation signal to generate the count value.

The frequency digital converter may include a frequency down converter configured to receive a reference frequency signal as a reference clock signal and divide the reference clock signal by using a reference frequency division ratio to generate the divided reference clock signal, a periodic timer configured to receive the oscillation signal as a sample clock signal, and generate a period counting value by counting one cycle time of the divided reference clock signal using the sample clock signal, and a Cascaded Integrator-Comb (CIC) filter circuit configured to generate the count value by performing cumulative amplification on the period counting value received from the periodic timer.

The operation detection circuit may be configured to generate a difference value by differentiating the count value received from the frequency digital converter, compare the difference value with a preset touch threshold value, and output a detection signal having a level based on a result of the comparing.

The touch detection circuit may include a delay device configured to receive the count value and delay the received count value by a period of time determined based on a delay control signal, and output a delay count value, a subtractor configured to generate a difference value by subtracting the count value from the delay count value; and a comparator configured to compare the difference value received from the subtractor with a preset touch threshold, and generate the detection signal which has a level that is based on a result of the comparison.

The comparator may be configured to generate a detection signal that has a level that indicates a touch occurrence when the difference value is equal to or less than the preset touch threshold.

The comparator may be configured to generate a detection signal that has a level that indicates a touch occurrence when the difference value rises to the preset touch threshold or higher after falling below the preset touch threshold.

In a general aspect, a method includes sensing, by a touch input pattern of a sensing device, a touch input, changing a capacitance of an oscillation circuit of the sensing device, generating an oscillation signal based on the change in capacitance, generating a detection signal by detecting the touch input based on a frequency included in the oscillation signal, and outputting a touch input detection signal.

The capacitance may be varied based on a touch occurrence that is sensed by the touch input pattern.

The method may further include converting the oscillation signal into a count value, and generating the detection signal based on the count value.

Other features and aspects will be apparent from the following detailed description, the drawings, and the claims.

Figure 1:
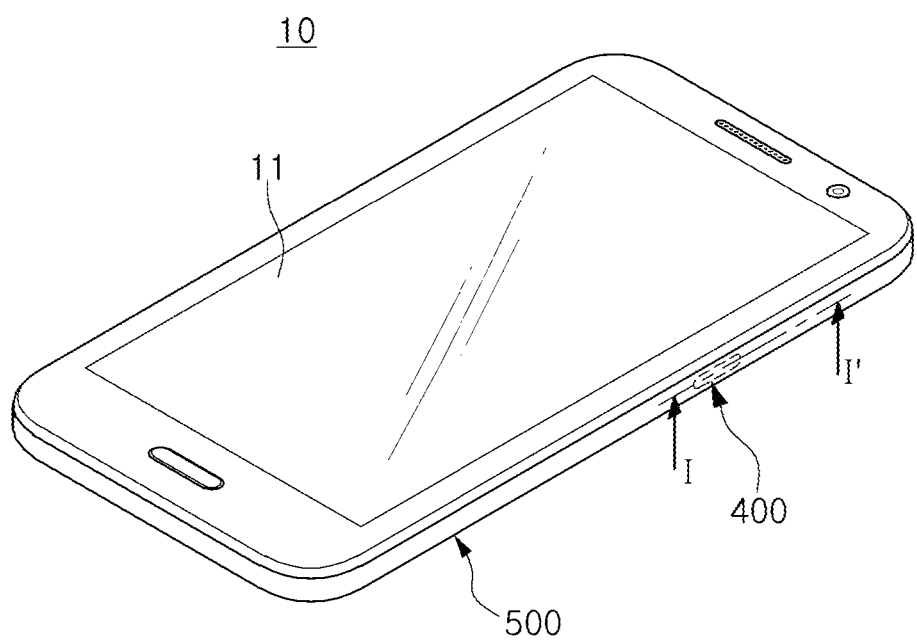
FIG. 1 is a view illustrating the exterior of a mobile device in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

FIG. 1 is a view illustrating an example of the exterior of a mobile device in accordance with one or more embodiments.

Referring to FIG. 1, a mobile device 10 according to an example may include a touch screen 11, a housing 500, and a fingerprint sensor 400.

For example, the fingerprint sensor 400 may include, but is not limited to, a touch input pattern (SWP, see FIG. 2) for a touch input, to perform a touch input by touching the fingerprint sensor 400, which will be described below.

In FIG. 1, an example in which the fingerprint sensor 400 is disposed on the side of the electronic device is illustrated. However, the examples are not limited thereto.

For example, referring to FIG. 1, the mobile device 10 may be a portable device, such as a smartphone, tablet, or notebook, or may be a wearable device, such as a smart watch, and is not limited to a specific device. The mobile device 10 may be a portable or wearable electric device or an electric device having a switch for operation control, but is not limited thereto.

In this specification, touch, touch input, and touch occurrence may indicate physical contact.

For the drawings of the present disclosure, overlapping descriptions of the same reference numerals and components of the same function may be omitted, and details of differences may be described for the drawings.

Figure 2:
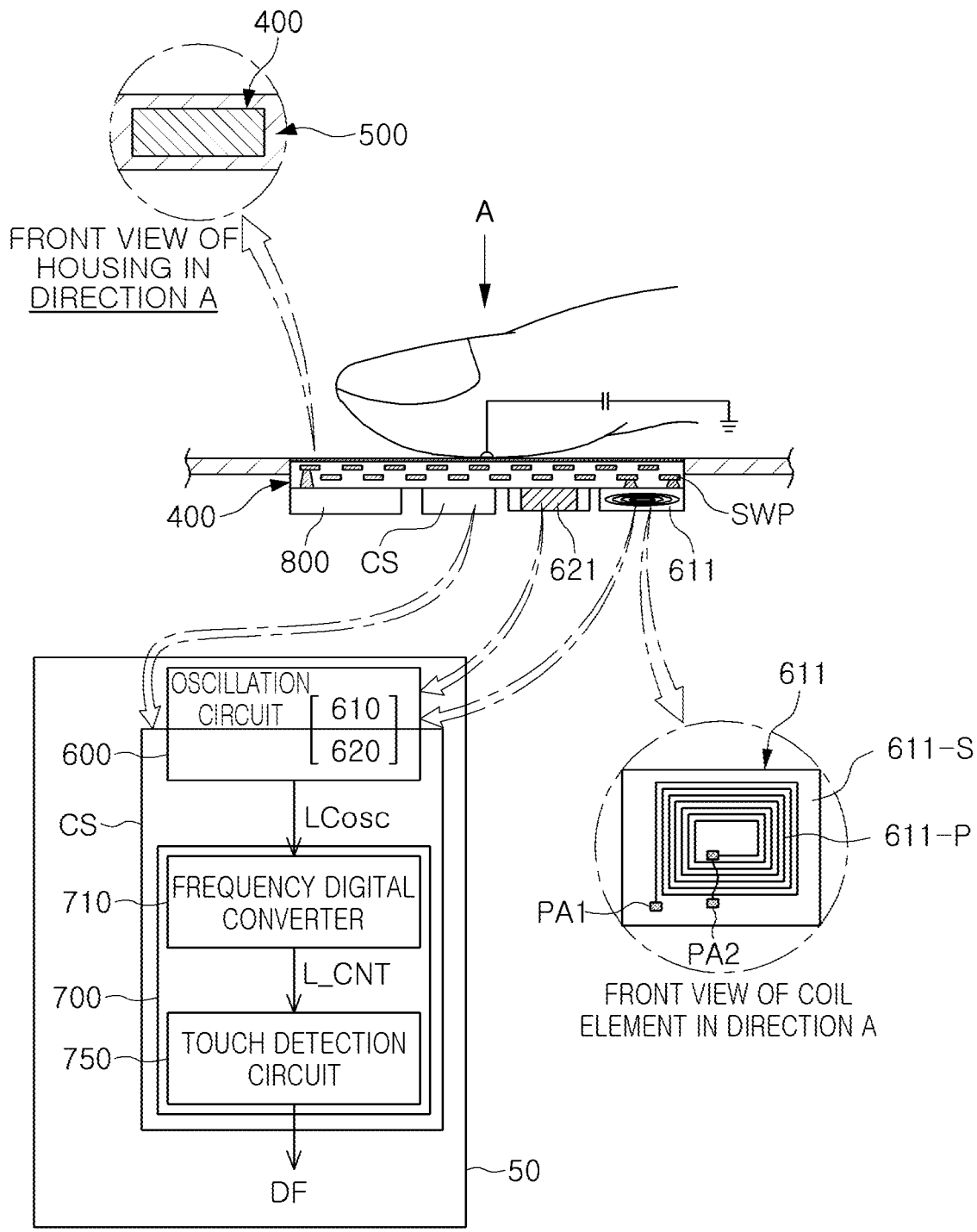
FIG. 2 is a diagram illustrating a sensing device in accordance with one or more embodiments.

FIG. 2 illustrates a sensing device in accordance with one or more embodiments.

Referring to FIG. 2, a sensing device according to an example may include a touch input pattern SWP, an oscillation circuit 600, and an operation detection circuit 700. The sensing device may be utilized to determine capacitance variances generated by one or more touch units.

The touch input pattern SWP may be included in the fingerprint sensor 400.

The oscillation circuit 600 is connected to the touch input pattern SWP. When a touch occurrence occurs via the touch input pattern SWP, or when a touch is detected by the touch input pattern, a capacitance of the oscillation circuit 600 is changed, and an oscillation signal LCosc may be generated based on a change in capacitance. For example, the oscillation circuit 600 may include an inductance circuit 610 including a coil element 611, and a capacitance circuit 620 including a capacitor device 621.

The operation detection circuit 700 may generate a detection signal DF by detecting a touch occurrence based on a frequency included in the oscillation signal LCosc input from the oscillation circuit 600.

The coil element 611, the capacitor device 621, and an operation sensing circuit unit CS may be disposed on one outer side of the fingerprint sensor 400, but is not so limited.

For example, the operation sensing circuit unit CS may include a portion of the oscillation circuit 600, and the operation detection circuit 700. The capacitor device 621 may be included in the operation sensing circuit unit CS or may be disposed as a separate device, for example, a multilayer ceramic capacitor (MLCC) disposed externally.

A resistor (not illustrated) may be further connected between the coil element 611 and the capacitor device 621, and the resistor may perform an electrostatic discharge (ESD) function.

For example, the operation sensing circuit unit CS may be an integrated circuit IC.

Referring to the front view of the housing in direction A of FIG. 2, the fingerprint sensor 400 may include the touch input pattern SWP and may be inserted into and disposed in the housing 500 of the electronic device.

Referring to the front view of the coil element 611 in direction A of FIG. 2, the inductance circuit 610 may include the coil element 611 disposed on an external surface of the fingerprint sensor 400 or embedded in the fingerprint sensor 400 and having an inductance (Lind).

The capacitance circuit 620 may include the capacitor device 621 connected to the inductance circuit 610 and having a capacitance Cext.

For example, the coil element 611 may be formed of a double-sided printed circuit board (PCB) or a multilayer PCB. In detail, the coil element 611 may include a coil pattern 611-P connected in a winding type between a first pad PA1 and a second pad PA2 disposed on a PCB substrate 611-S. The first pad PA1 and the second pad PA2 may be electrically connected to the oscillation circuit 600 through the fingerprint sensor 400.

Figure 3:
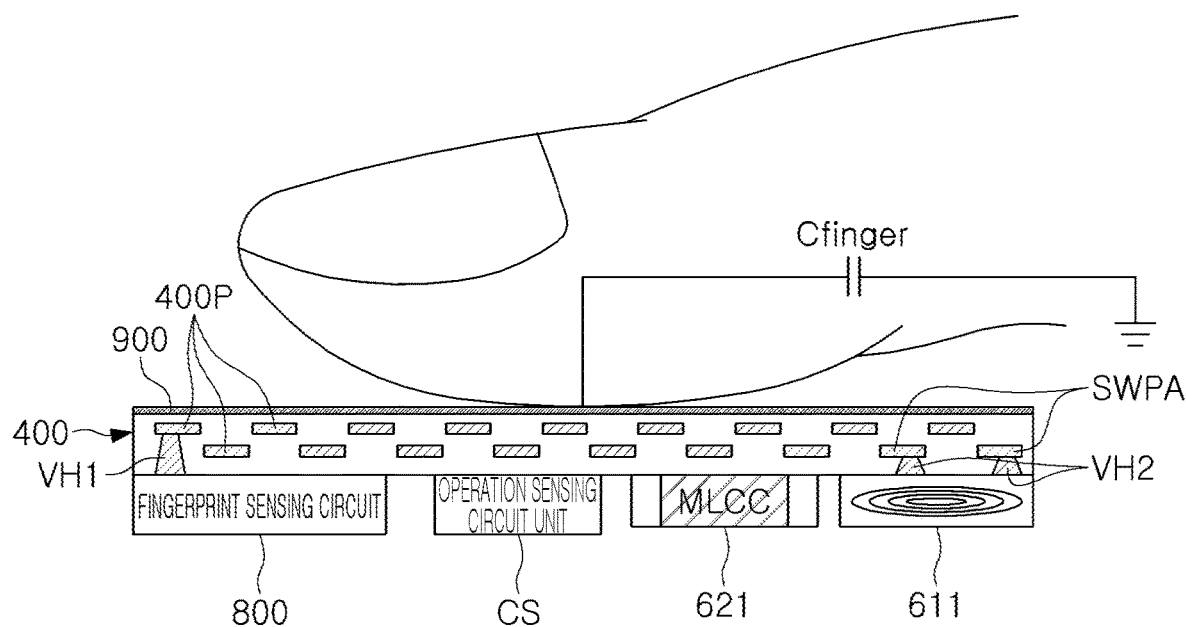
FIG. 3 is a drawing illustrating a first example of a sensing device including a cross-sectional structure, taken along line I-I' of FIG. 1.
Figure 4:
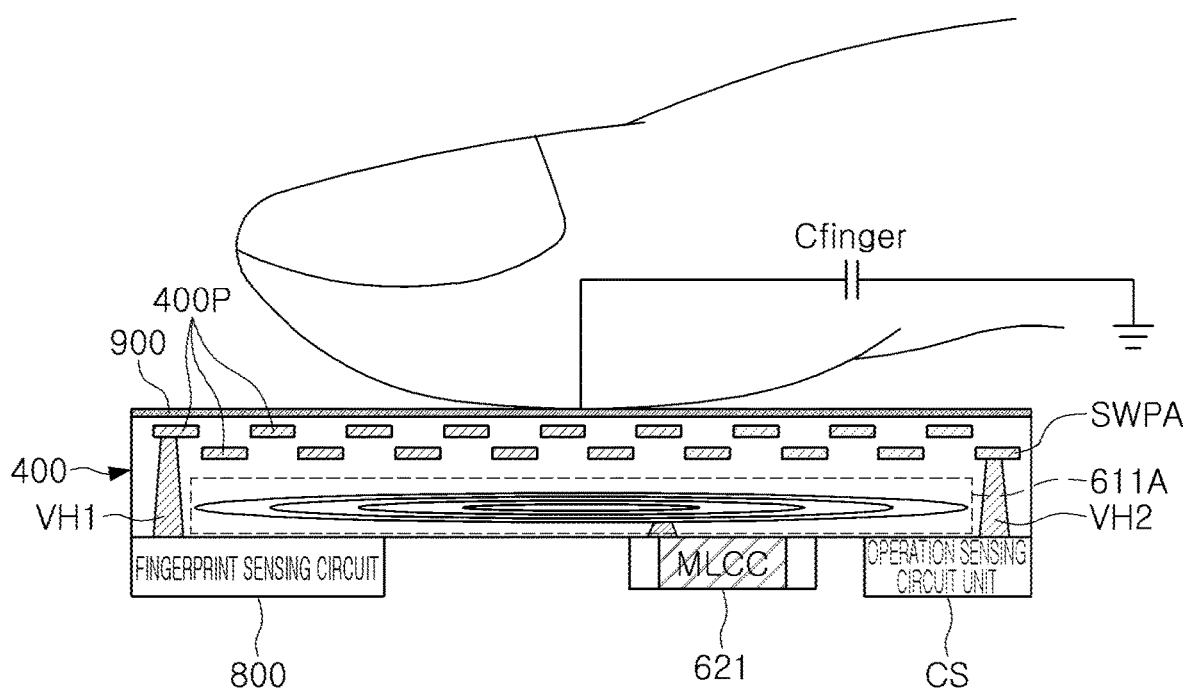
FIG. 4 is a drawing illustrating a second example of the sensing device including a cross-sectional structure taken along line I-I' of FIG. 1.

FIG. 3 illustrates a first example of a sensing device including a cross-sectional structure, taken along line I-I' of FIG. 1, and FIG. 4 is a drawing illustrating a second example of the sensing device including the cross-sectional structure taken along line I-I' of FIG. 1.

Referring to FIGS. 3 and 4, the fingerprint sensor 400 may be inserted into and disposed in the housing 500. A fingerprint sensing circuit 800, the operation sensing circuit unit CS, the coil element 611, and the capacitor device 621 may be disposed on one surface of the fingerprint sensor 400.

The coil element 611 may be disposed on an external surface of the fingerprint sensor 400 and may be included in the inductance circuit 610 of the oscillation circuit 600. The capacitor device 621 may be disposed on an external surface of the fingerprint sensor 400, spaced apart from the coil element 611, and included in the capacitance circuit 620 of the oscillation circuit 600.

For example, the coil element 611 may be an individual coil element such as a solenoid coil or a wound inductor, a chip inductor, or the like, but is not limited thereto and may be an element which has inductance.

In addition, the capacitance circuit 620 may include a capacitance that is varied by a touch occurrence through the touch input pattern SWPA.

Referring to FIG. 4, the coil element 611 included in the inductance circuit 610 of the oscillation circuit 600 may be embedded in the fingerprint sensor 400.

Accordingly, the electronic device to which the sensing device is applied may be miniaturized.

Referring to FIGS. 3 and 4, the touch input pattern SWPA may be a conductor pattern that implements a portion of a plurality of fingerprint recognition patterns 400P included in the fingerprint sensor 400.

For example, while the fingerprint sensor 400 is inserted into the housing 500, an external surface of the fingerprint sensor 400, for example, an upper surface of the fingerprint sensor 400 in FIG. 2, and an external surface of the housing may be selectively covered with an insulator 900. The insulator 900 may be skin-coding.

In the inside of the housing 500 of the electronic device, for example, on an inner surface of the fingerprint sensor 400, for example, on a lower portion thereof in FIG. 2, the fingerprint sensing circuit 800, the operation sensing circuit unit CS, the capacitor device 621 such as an MLCC, and the coil element 611 may be disposed, but an example thereof is not limited thereto.

The fingerprint sensing circuit 800 may be electrically connected to the fingerprint sensor 400. The operation sensing circuit unit CS may include a portion of the oscillation circuit 600, and the operation detection circuit 700.

For the drawings according to examples, overlapping descriptions of the same reference numerals and components having the same function may be omitted, and details of differences may be described for the drawings.

Figure 5:
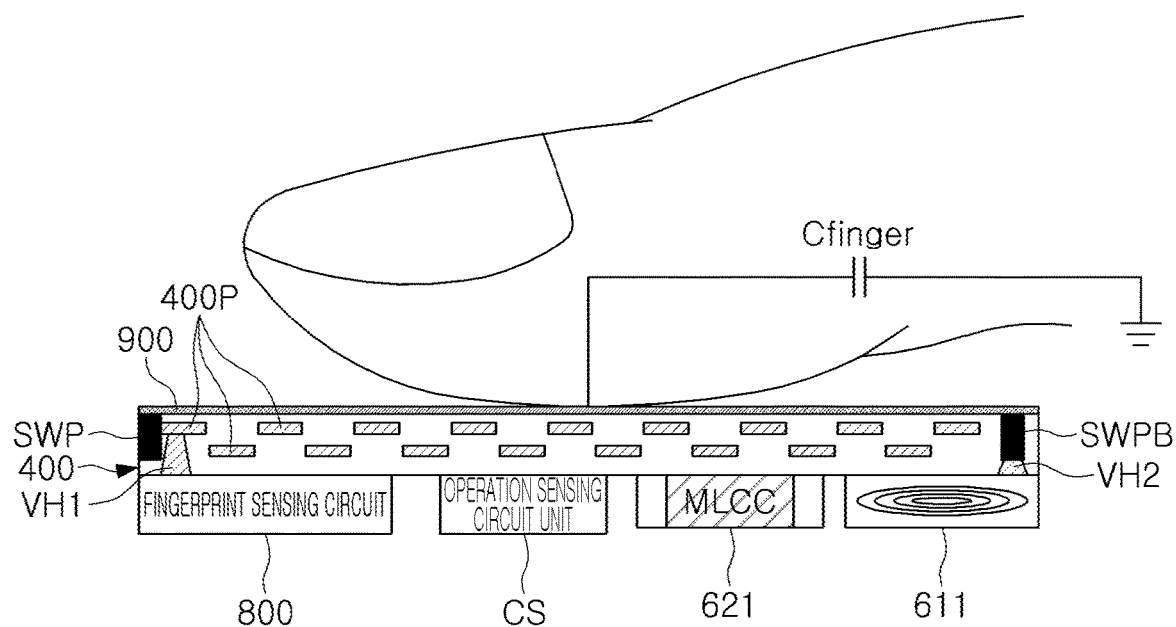
FIG. 5 is a drawing illustrating a third example of the sensing device including a cross-sectional structure taken along line I-I' of FIG. 1.
Figure 6:
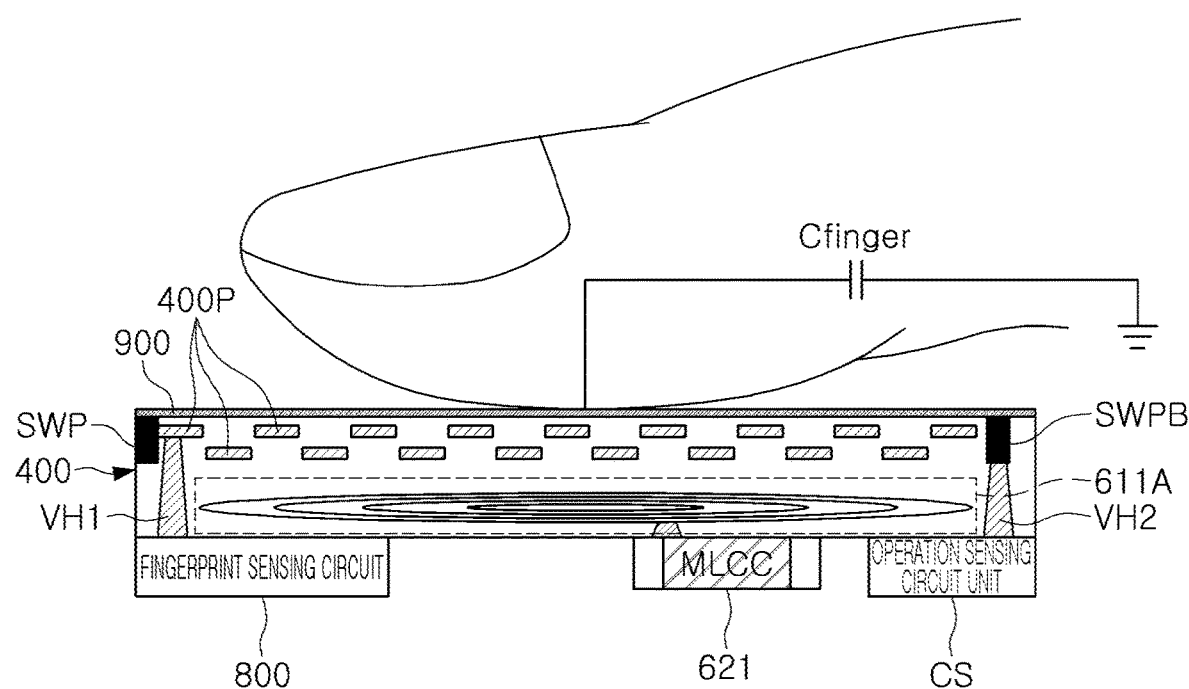
FIG. 6 is a drawing illustrating a fourth example of the sensing device including a cross-sectional structure taken along line I-I' of FIG. 1.

FIG. 5 illustrates a third example of the sensing device including a cross-sectional structure taken along line I-I' of FIG. 1, and FIG. 6 is a drawing illustrating a fourth example of the sensing device including a cross-sectional structure taken along line I-I' of FIG. 1.

Referring to FIGS. 5 and 6, the touch input pattern SWPB may be a conductor pattern disposed separately from the plurality of fingerprint recognition patterns 400P included in the fingerprint sensor 400.

For example, the fingerprint sensor 400 may include the fingerprint recognition pattern 400P for fingerprint recognition. The touch input pattern SWPB may be a conductor pattern disposed in the fingerprint sensor 400 separately from the fingerprint recognition pattern 400P of the fingerprint sensor 400.

Referring to FIG. 5, the coil element 611 may be an individual component, for example, an MLCC, disposed on one external surface of the fingerprint sensor 400, for example, an inner surface of the fingerprint sensor 400 opposite to the external surface of the fingerprint sensor 400. The position of the coil element 611 is not limited to the position illustrated in FIG. 5, and may be disposed in various positions, such as a side surface, an upper surface, and a lower surface of the fingerprint sensor 400.

In FIG. 5, the shape of the coil element 611 does not need to be specifically defined, and may be formed in various shapes such as a circle or a quadrangle as non-limiting examples. For example, the PCB itself may be implemented as a flexible PCB and may also be a chip inductor, and additionally, an integrated circuit (IC) or/and a capacitor for sensing may be disposed.

Referring to FIGS. 4 and 6, a coil element 611A may have a structure that is embedded in the fingerprint sensor 400. In this example, the touch input pattern SWPA or SWPB included in the fingerprint sensor 400 may be connected to the operation sensing circuit unit CS through a second via hole VH2, and may be connected to the coil element 611A through the operation sensing circuit unit CS.

As the coil element 611A is disposed directly below the fingerprint recognition pattern 400P of the fingerprint sensor 400, good sensing sensitivity, small size and simple assembly characteristics may be provided, and sensing may be performed without deflection.

The fingerprint recognition pattern 400P may be electrically connected to the lower fingerprint sensing circuit 800 through a first via hole VH1.

Figure 7:
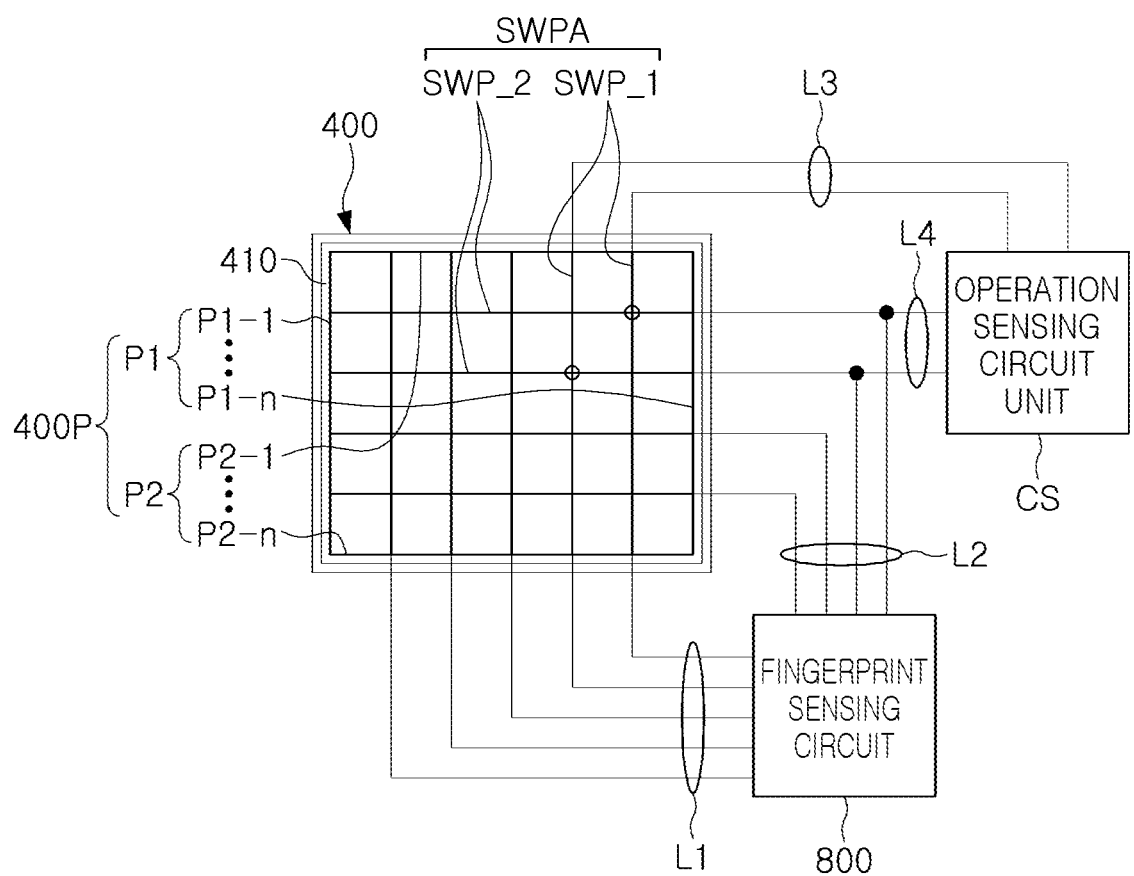
FIG. 7 is a drawing illustrating an example of a touch input pattern included in a fingerprint sensor in accordance with one or more embodiments.
Figure 8:
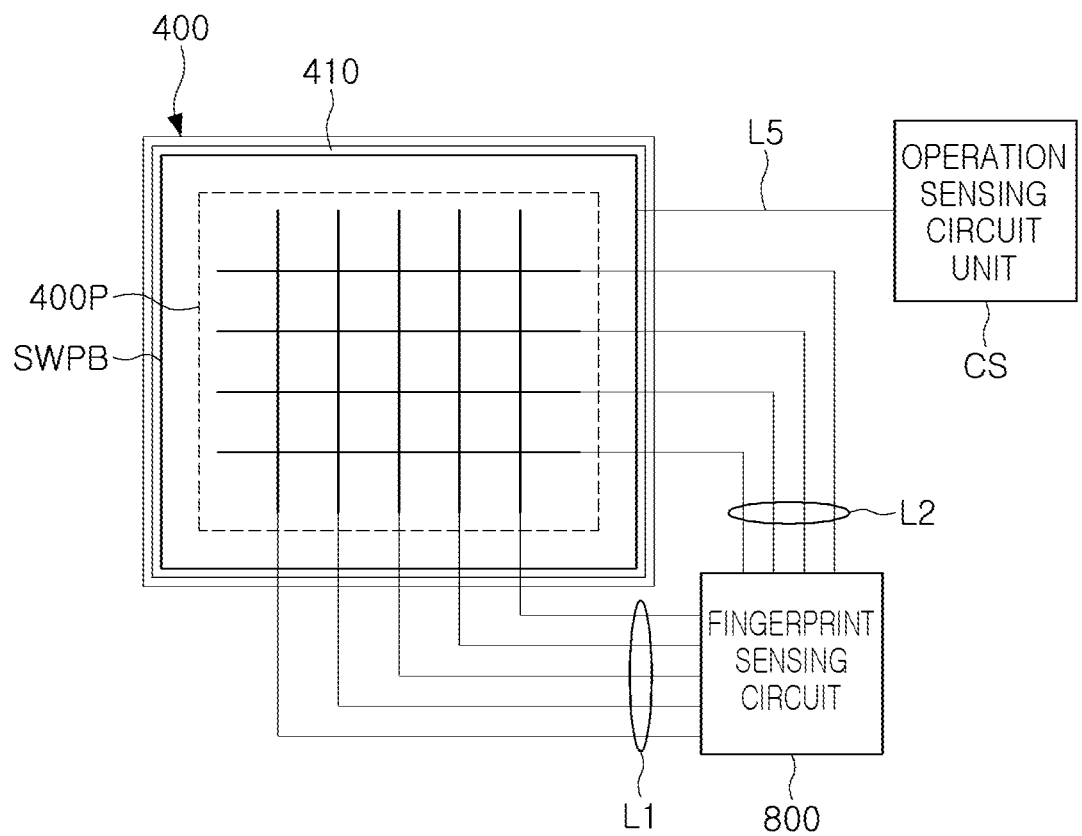
FIG. 8 is a drawing illustrating an example of a touch input pattern included in a fingerprint sensor in accordance with one or more embodiments.

FIG. 7 illustrates an example of a touch input pattern included in a fingerprint sensor, and FIG. 8 illustrates an example of a touch input pattern included in a fingerprint sensor.

Referring to FIGS. 7 and 8, as described above, the fingerprint sensor 400 may include a substrate 410 and the fingerprint recognition pattern 400P.

The fingerprint recognition pattern 400P may include a plurality of first conductor patterns P1 (see FIG. 4) disposed side by side in a first direction, for example, a vertical direction, on the substrate 410, and a plurality of second conductor patterns P2 (see FIG. 4) disposed side by side in a second direction, for example, a horizontal direction, and spaced apart from the plurality of first conductor patterns P1.

Additionally, the fingerprint sensor 400 may include the touch input pattern SWPA for sensing a touch occurrence. For example, referring to FIG. 7, the touch input pattern SWPA may be a partial pattern of the fingerprint recognition pattern 400P included in the fingerprint sensor 400, as illustrated in FIGS. 3 and 4. Alternatively, referring to FIG. 8, the touch input pattern SWPA may be a color pattern disposed separately from the fingerprint recognition pattern 400P, as illustrated in FIGS. 5 and 6.

Referring to FIG. 7, for example, the fingerprint sensing circuit 800 may be electrically connected to the plurality of first conductor patterns P1 of the fingerprint sensor 400 through a first line L1, and may be electrically connected to the plurality of second conductor patterns P2 of the fingerprint sensor 400 through a second line L2.

The operation sensing circuit unit CS may be connected to the touch input pattern SWPA, a partial pattern of the fingerprint recognition pattern 400P included in the fingerprint sensor 400. For example, the touch input pattern SWPA may include at least one pattern of, for example, P1-1 to P1-$n$, among the plurality of first conductor patterns P1 included in the fingerprint sensor 400, and at least one pattern of, for example, P2-1 to P2-$m$, among the plurality of second conductor patterns P2, to detect variable capacitance varied during a touch occurrence. In an example, the variable capacitance may be generated in response to an approaching touch of an object or an actual touch of an object, for example a thumb, a finger, or a stylus pen.

The operation sensing circuit unit CS may be connected to at least one of the plurality of first conductor patterns P1 of the fingerprint sensor 400 through a third line L3, and may be connected to at least one of the plurality of second conductor patterns P2 of the fingerprint sensor 400 through a fourth line L4.

For example, referring to FIG. 7, the touch input pattern SWPA (for example, SWP-1 and SWP-2), which is a portion of the fingerprint recognition pattern 400P included in the fingerprint sensor 400, may include two patterns P1-5 and P1-6 among the plurality of first conductor patterns P1 of the fingerprint sensor 400, and two patterns P2-2 and P2-3 among the plurality of second conductor patterns P2 of the fingerprint sensor 400.

For example, the operation sensing circuit unit CS may detect variable capacitance during the touch occurrence, between two patterns P1-5 and P1-6 of the plurality of first conductor patterns P1, and two patterns P2-2 and P2-3 of the plurality of second conductor patterns P2.

Referring to FIG. 8, as an example, the fingerprint sensor 400 may include the fingerprint recognition pattern 400P disposed on the substrate 410, and a separately added touch input pattern SWPB to detect a touch occurrence.

In an example, the substrate 410 of the fingerprint sensor 400 may be a multilayer substrate including the plurality of first conductor patterns and the plurality of second conductor patterns.

The operation sensing circuit unit CS may be connected to the touch input pattern SWPB included in the fingerprint sensor 400 through a fifth input line L5, to detect variable capacitance during touch occurrence, for example.

For example, when the fingerprint sensor 400 is touch-operated, a touch capacitance Ctouch (see FIG. 11) may be generated in relation to the touch input pattern SWPB, and thus the total capacitance may be varied, as described below.

Figure 9:
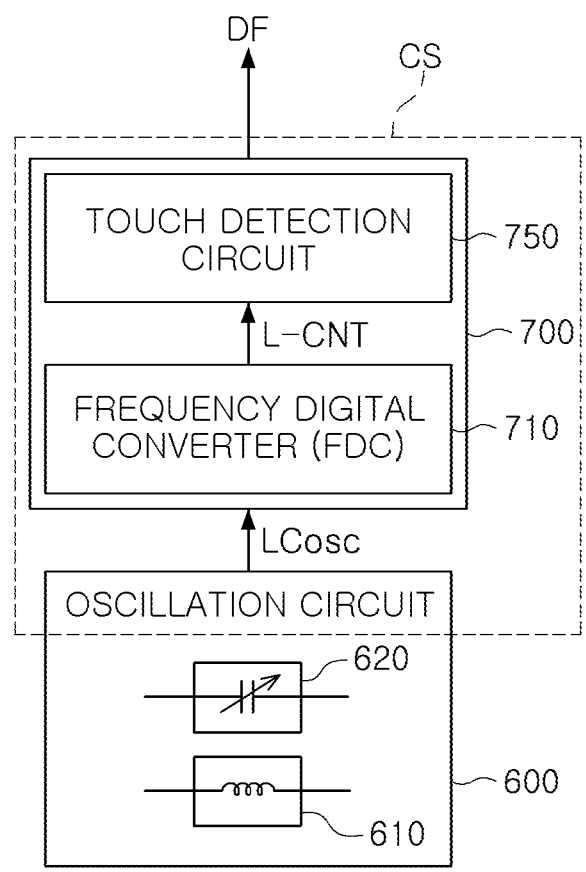
FIG. 9 is a diagram illustrating an example of an operation detection circuit and an oscillation circuit in accordance with one or more embodiments.

FIG. 9 illustrates an example of an operation detection circuit and an oscillation circuit.

Referring to FIG. 9, the operation detection circuit 700 may include a frequency digital converter 710 and a touch detection circuit 750.

In an example, the frequency digital converter 710 may convert the oscillation signal LCosc from the oscillation circuit 600 into a count value L_CNT. The touch detection circuit 750 may generate a detection signal DF by detecting a touch occurrence based on a count value L_CNT input from the frequency digital converter 710.

The oscillation circuit 600 may include an inductance circuit 610 and a capacitance circuit 620.

The inductance circuit 610 may include inductance. The capacitance circuit 620 may include a capacitance that is varied based on a touch occurrence.

Figure 10:
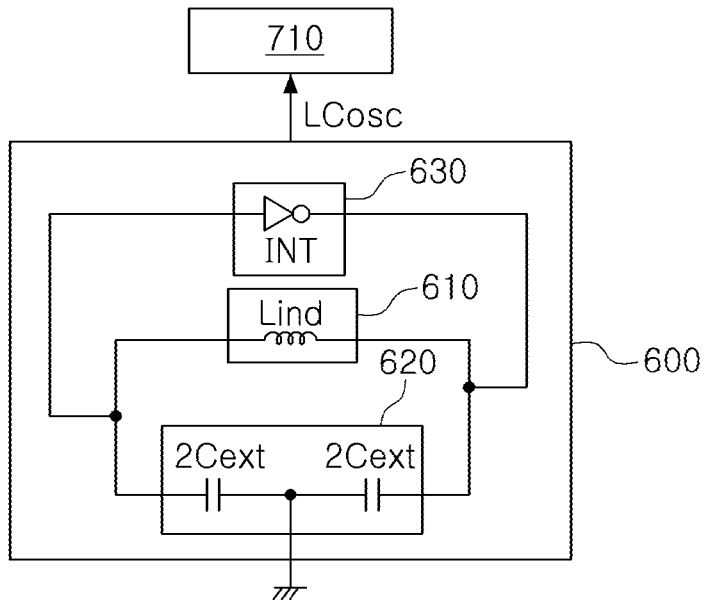
FIG. 10 is a diagram illustrating an example of an oscillator circuit in an example in which there is no touch in accordance with one or more embodiments.
Figure 11:
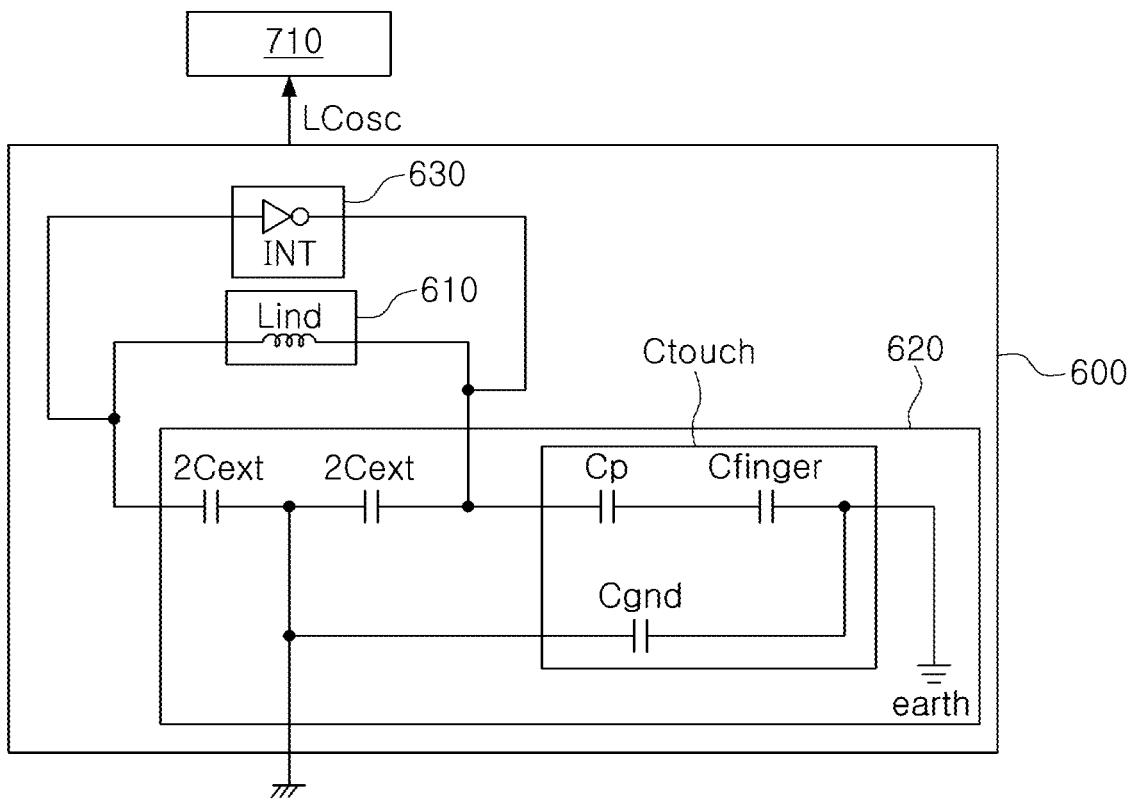
FIG. 11 is a diagram illustrating an example of an oscillator circuit in an example in which there is a touch in accordance with one or more embodiments.

FIG. 10 illustrates an example of an oscillator circuit in an example in which there is no touch, and FIG. 11 illustrates an example of an oscillator circuit in an example in which there is a touch.

Referring to FIG. 10, when there is no touch, the oscillation circuit 600 may include the inductance circuit 610, the capacitance circuit 620, and an amplifier circuit 630.

The inductance circuit 610 may include the coil element 611 (see FIG. 2) having an inductance Lind. The capacitance circuit 620 may include the capacitor device 621 (see FIG. 2) having a capacitance Cext (2Cext, 2Cext).

The inductance circuit 610 and the capacitance circuit 620 may form a parallel LC resonance circuit, and the parallel LC resonance circuit may generate a resonance signal including a first resonant frequency fres1.

The amplification circuit 630 may generate an oscillation signal LCosc by amplifying a resonance signal generated in the parallel LC resonance circuit comprised of the inductance circuit 610 and the capacitance circuit 620.

For example, the first resonant frequency fres1 included in the oscillation signal LCosc generated by the oscillation circuit 600 may be represented by Equation 1 below.

$$fres1 \approx \frac{1}{2\pi\sqrt{(Lind * Cext)}} \quad \text{Equation 1}$$

In Equation 1, refers to 'the same or similar', where 'similar' indicates that another value may be further included.

Referring to FIG. 11, in an example where there is a touch, the capacitance circuit 620 of the oscillation circuit 600 may include the capacitance Cext (2Cext, 2Cext) of the capacitor element 621 (see FIG. 2), and the touch capacitance Ctouch formed during touch.

For example, the touch capacitance Ctouch may include a plurality of capacitances Cp, Cfinger and Cgnd, where Cp is a parasitic capacitance, Cfinger is a capacitance of the finger, and Cgnd is a ground capacitance.

Accordingly, it can be seen that the total capacitance of the oscillation circuit 600 of FIG. 11 may be varied by the touch capacitance Ctouch, in comparison with the total capacitance of the oscillation circuit 600 of FIG. 10.

For example, in an equivalent circuit in which the capacitance Cext of the capacitor element 621 (see FIG. 2) is divided into two capacitances 2Cext and 2Cext and an intermediate node of the two capacitances 2Cext and 2Cext is grounded, the touch capacitance Ctouch may be connected in parallel to one capacitance 2Cext or the other capacitance 2Cext.

For example, a parasitic capacitance Cp, a finger capacitance Cfinger, and a ground capacitance Cgnd included in the touch capacitance Ctouch may be connected to one capacitance 2Cext in parallel.

For example, when there is a touch, the second resonant frequency fres2 included in the oscillation signal LCosc generated by the oscillation circuit 600 may be represented by Equation 2 below.

$$fres2 \approx \frac{1}{2\pi\sqrt{(Lind * [2Cext\|(2Cext + CT)])}} \quad \text{Equation 2}$$

$$CT \approx Cp\|Cfinger\|Cgnd$$

In Equation 2, refers to 'the same or similar', where 'similar' indicates that another value may be further included.

In Equation 2, Cp is a parasitic capacitance existing between the touch input pattern (SWP or SWPA or SWPB) and the coil element 611, Cfinger is a capacitance of the human body, and Cgnd is a ground return capacitance between a circuit ground and an earth.

In Equation 2, when II is defined as follows, 'a∥b' is defined that 'a' and 'b' are in series circuit connection and the sum value thereof is '(a*b)/(a+b)'.

Comparing Equation 1 (when there is no touch) and Equation 2 (when there is touch), since the capacitance 2Cext of Equation 1 is increased to the capacitance 2Cext+ CT of Equation 2, it can be seen that the first resonant frequency fres1 without touch is lowered to the second resonant frequency fres2 with touch.

Referring back to FIGS. 10 and 11, the oscillation circuit 600 may output an oscillation signal LCosc having the first resonant frequency fres1 in the absence of a touch or an oscillation signal LCosc having the second resonant frequency fres2 in the presence of a touch to the frequency digital converter 710.

Figure 12:
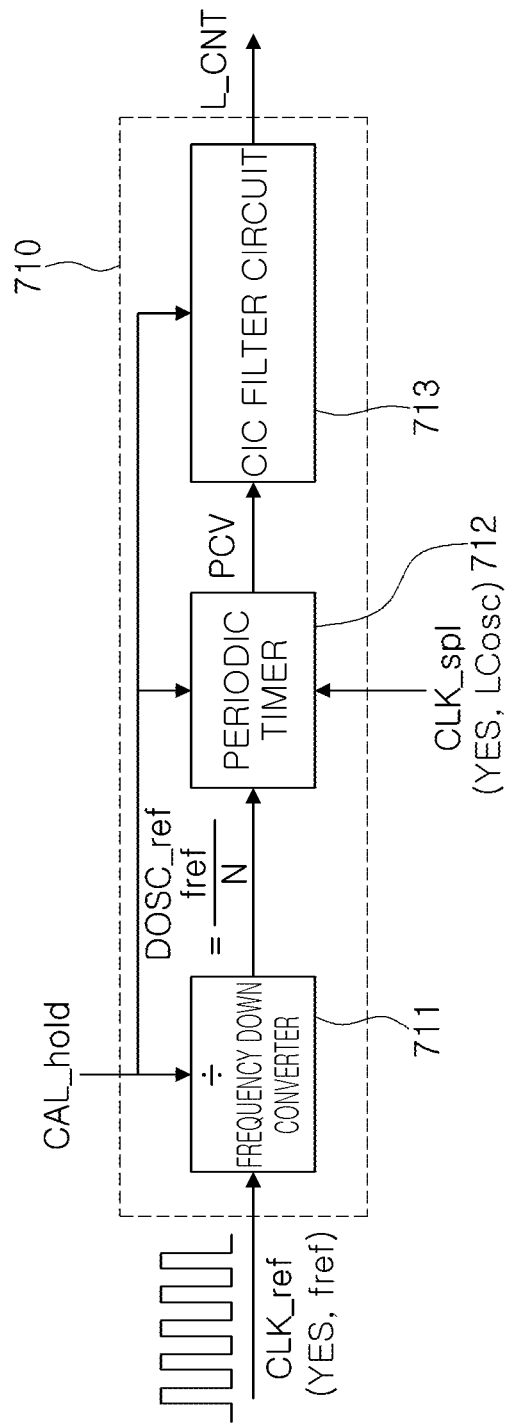
FIG. 12 is a drawing illustrating an example of a frequency digital converter in accordance with one or more embodiments.

FIG. 12 illustrates an example of a frequency digital converter in accordance with one or more embodiments.

Referring to FIG. 12, the frequency digital converter 710 may generate a count value L_CNT by counting a reference clock signal CLK_ref using the oscillation signal LCosc.

For example, the frequency digital converter 710 divides a reference frequency signal fref by using a reference frequency division ratio N to generate a divided reference clock signal DOSC_ref, fref/N, divides the oscillation signal Losc from the oscillation circuit 600 by using a sensing frequency division ratio M, and generates the count value (L_CNT) by counting the divided reference clock signal fref/N using the divided oscillation signal LCosc/M.

In an example, the frequency digital converter 710 may include a frequency down converter 711, a periodic timer 712, and a Cascaded Integrator-Comb (CIC) filter circuit 713.

The frequency down converter 711 receives a reference frequency signal fref as a reference clock signal CLK_ref, and divides the reference clock signal CLK_ref by using the reference frequency division ratio N to generate the divided reference clock signal (DOSC_ref).

The periodic timer 712 receives the oscillation signal LCosc as a sample clock signal CLK_spl, and counts one cycle time of the divided reference clock signal DOSC_ref using the sample clock signal CLK_spl, to generate a period counting value (PCV).

In an example, the CIC filter circuit 713 may include a decimator CIC filter. As another example, the CIC filter circuit 715 may include the decimator CIC filter and a primary CIC filter.

The decimator CIC filter may generate the count value L_CNT as in Equation 3 below by performing cumulative amplification on the period counting value PCV received from the periodic timer 712. The primary CIC filter may remove noise by obtaining a moving average of the output from the decimator CIC filter.

$$L\_CNT = (N * LCosc)/(M * fref) \quad \text{Equation 3}$$

In Equation 3, LCosc is the frequency of the oscillation signal (an oscillation frequency), fref is the frequency of the reference frequency signal (a reference frequency), N is the reference frequency (for example, 32 Khz) division ratio, and M is the division ratio of the oscillation frequency.

As illustrated in Equation 3, dividing the oscillation frequency LCosc by the reference frequency fref indicates that the period of the reference frequency fref is counted using the oscillation frequency LCosc. When the count value L_CNT is obtained as described above, a low reference frequency fref may be used, and the precision of the count may be increased.

Figure 13:
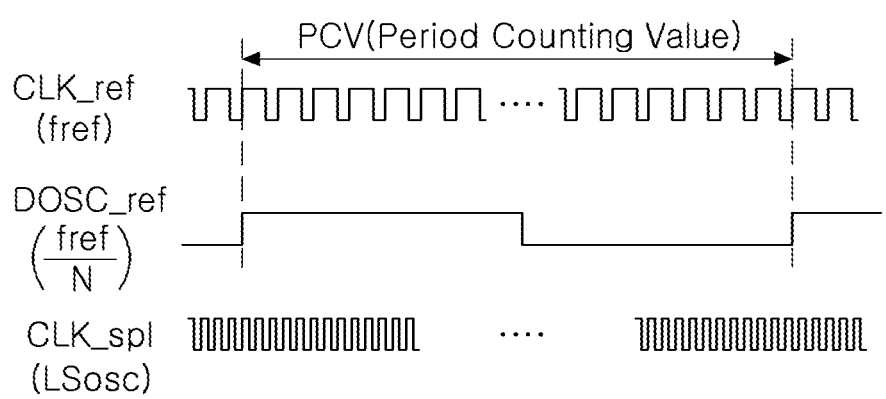
FIG. 13 is an illustrative diagram of the operation of a periodic timer in accordance with one or more embodiments.

FIG. 13 is an illustrative diagram of the operation of the periodic timer in accordance with one or more embodiments.

Referring to FIG. 13, as described above, the reference clock signal CLK_ref may be one of the oscillation signal LCosc and the reference frequency signal fref. The reference frequency signal fref may be a signal by an external crystal and may be an oscillation signal such as RC or PLL inside an IC.

For example, when the reference clock signal CLK_ref is an oscillation signal LCosc input from the oscillation circuit 600 (see FIG. 2), the sample clock signal CLK_spl may be a reference frequency signal fref, and in this case, the divided oscillation signal may be 'LCosc/M'.

Alternatively, when the reference clock signal CLK_ref is a reference frequency signal fref, the sample clock signal CLK_spl may be an oscillation signal LCosc, and in this case, the divided oscillation signal may be 'fref/N'.

In the examples, the count value L_CNT is a digital value generated by a count processing operation by digital signal processing rather than analog signal processing. Therefore, the count value L_CNT may not be generated by signal amplification by a simple analog amplifier, but may be generated by a count processing operation by the frequency digital converter 710 proposed by an example embodiment of the present disclosure. This counting operation requires a reference clock signal (for example, a reference frequency signal) and a sample clock signal (for example, an oscillation signal), which will be described later.

Figure 14:
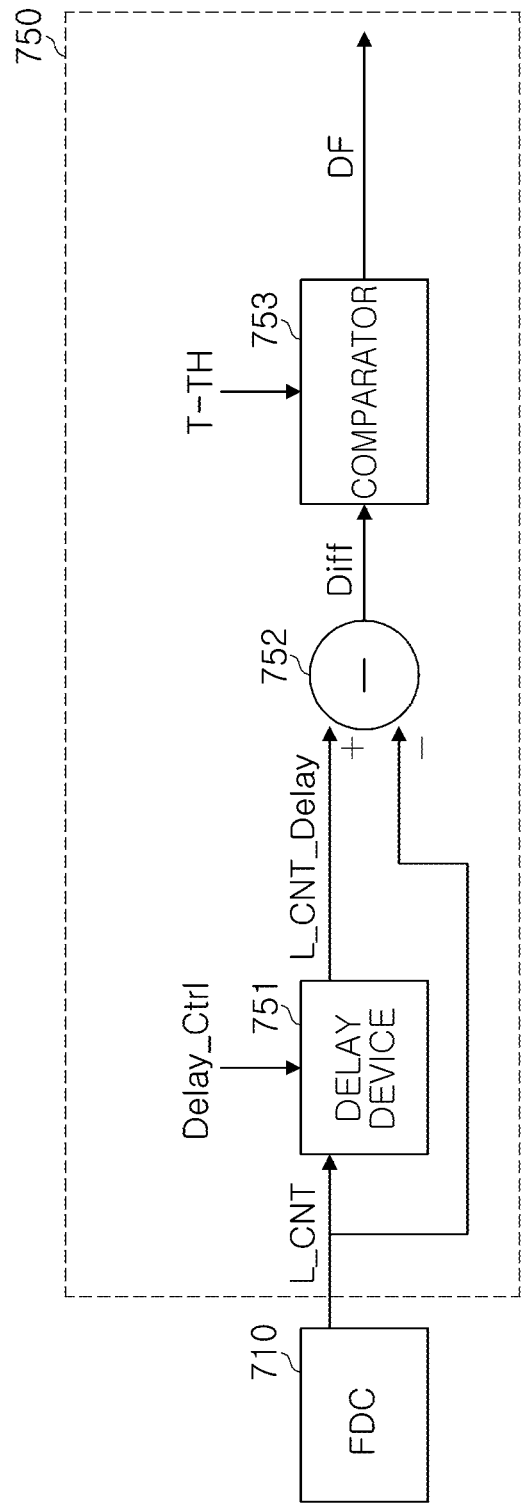
FIG. 14 is a drawing illustrating an example of a touch detection circuit in accordance with one or more embodiments.

FIG. 14 illustrates an example of a touch detection circuit in accordance with one or more embodiments.

Referring to FIG. 14, the touch detection circuit 750 generates a difference value Diff by differentiating the count value L_CNT received from the frequency digital converter, and compares the difference value Diff with a preset touch threshold value T-TH to output a detection signal DF having a level based on the comparison result.

For example, the touch detection circuit 750 may include a delay device 751, a subtractor 752, and a comparator 753.

The delay device 751 may output a delay count value L_CNT_Delay by delaying the count value L_CNT received from the frequency digital converter 710 by a period of time determined based on the delay control signal Delay_Ctrl.

The subtractor 752 may generate the difference value Diff by subtracting the count value L_CNT from the delay count value L_CNT_Delay from the delay unit 751.

The comparator 753 compares the difference value Diff received from the subtractor 752 with the preset touch threshold value T-TH, and may generate the detection signal DF having a level based on the comparison result.

For example, the comparator 753 compares the difference value Diff and the touch threshold value T-TH output from the subtractor 752, to output a high level detection signal DF when the difference value Diff is greater than the touch threshold value T-TH and to output a low level detection signal DF when the difference value Diff is less than or equal to the touch threshold value T-TH.

The comparator 753 may generate a detection signal DF having a level indicating a touch occurrence when the difference value Diff rises to the touch threshold value T-TH or higher after falling below the touch threshold value T-TH.

As another example, the comparator 753 may have hysteresis characteristics. For example, the touch threshold value T-TH for switching from a low level to a high level may correspond to ⅛ of a difference value range, and the touch threshold value T-TH for switching from the high level to the low level may correspond to ¹⁄₁₆ of the difference value range.

On the other hand, in examples of the present disclosure, when a method using the difference value Diff, for example, a slope detection method of the count value L_CNT, is applied, in the case in which the count value L_CNT may be 3639000 without touch and the count value L_CNT may be 3636000 at the touch, 3637500 may be set as the touch threshold value, and the touch may be recognized when the count value L_CNT at the time of the touch falls to the touch threshold value or lower.

Such a slope detection method is a method of recognizing a touch when a difference of a predetermined level or more occurs by calculating a difference between a count value L_CNT_Delay of a predetermined past time and a current count value L_CNT. In the example of the drift of the count value L_CNT due to the temperature change, since a value slowly changes over a long time, it is not recognized as a touch.

The sensing device according to an example as described above may be applied to an electrical device with a fingerprint sensor.

As set forth above, according to examples, by using a fingerprint sensor provided in an electronic device, the touch input may be sensed, dustproof and waterproof functions may be implemented, a model with a smooth design and a sense of unity may be manufactured, and the touch input sensing structure may be miniaturized.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A sensing device comprising:
   a sensor;
   a touch input pattern included in the sensor;
   a plurality of fingerprint recognition patterns included in the sensor, and disposed separately from the touch input pattern;
   an oscillation circuit connected to the touch input pattern, and configured to change a capacitance of the oscillation circuit when a touch occurrence is sensed by the touch input pattern, and generate an oscillation signal based on the change in the capacitance; and
   a detection circuit configured to detect the touch occurrence based on a frequency included in the oscillation signal and generate a detection signal.

2. The device of claim 1, wherein the oscillation signal is input to the operation detection circuit from the oscillation circuit.

3. The device of claim 1, wherein the sensor is a fingerprint sensor.

4. The device of claim 3, wherein the touch input pattern is a conductor pattern that includes a portion of the plurality of fingerprint recognition patterns included in the fingerprint sensor.

5. The device of claim 3, wherein the touch input pattern is a conductor pattern that is disposed separately from the plurality of fingerprint recognition patterns included in the fingerprint sensor.

6. The device of claim 3, wherein the oscillation circuit comprises:
   an inductance circuit comprising a coil element disposed on an external surface of the fingerprint sensor; and
   a capacitance circuit disposed on the external surface of the fingerprint sensor, and comprising a capacitor device spaced apart from the coil element.

7. The device of claim 6, wherein the capacitance circuit comprises a capacitance that is varied by the touch occurrence that is sensed by the touch input pattern.

8. The device of claim 3, wherein the oscillation circuit comprises:
   an inductance circuit comprising a coil element embedded in the fingerprint sensor; and
   a capacitance circuit comprising a capacitor device disposed on an external surface of the fingerprint sensor.

9. The device of claim 8, wherein the capacitance circuit comprises a capacitance that is varied by the touch occurrence that is sensed by the touch input pattern.

10. The device of claim 1, wherein the operation detection circuit comprises:
    a frequency digital converter configured to convert the generated oscillation signal into a count value; and
    a touch detection circuit configured to detect the touch occurrence based on the count value input from the frequency digital converter, and generate a detection signal.

11. The device of claim 10, wherein the frequency digital converter is configured to generate the count value by counting a reference clock signal based on the oscillation signal.

12. The device of claim 10, wherein the frequency digital converter is configured to:
    divide a reference frequency signal by using a reference frequency division ratio to generate a divided reference clock signal,
    divide the generated oscillation signal by using a sensing frequency division ratio, and
    count the divided reference clock signal by using the divided oscillation signal to generate the count value.

13. The device of claim 10, wherein the frequency digital converter comprises:
    a frequency down converter configured to receive a reference frequency signal as a reference clock signal and divide the reference clock signal by using a reference frequency division ratio to generate the divided reference clock signal;
    a periodic timer configured to receive the oscillation signal as a sample clock signal, and generate a period counting value by counting one cycle time of the divided reference clock signal using the sample clock signal; and
    a Cascaded Integrator-Comb (CIC) filter circuit configured to generate the count value by performing cumulative amplification on the period counting value received from the periodic timer.

14. The device of claim 10, wherein the operation detection circuit is configured to:
    generate a difference value by differentiating the count value received from the frequency digital converter;
    compare the difference value with a preset touch threshold value; and
    output a detection signal having a level based on a result of the comparing.

15. The device of claim 10, wherein the touch detection circuit comprises:
    a delay device configured to receive the count value and delay the received count value by a period of time determined based on a delay control signal, and output a delay count value;
    a subtractor configured to generate a difference value by subtracting the count value from the delay count value; and
    a comparator configured to compare the difference value received from the subtractor with a preset touch threshold, and generate the detection signal which has a level that is based on a result of the comparison.

16. The device of claim 15, wherein the comparator is configured to generate a detection signal that has a level that indicates a touch occurrence when the difference value is equal to or less than the preset touch threshold.

17. The device of claim 15, wherein the comparator is configured to generate a detection signal that has a level that indicates a touch occurrence when the difference value rises to the preset touch threshold or higher after falling below the preset touch threshold.

18. A method comprising:
   sensing, by a touch input pattern of a sensing device, a touch input;
   changing a capacitance of an oscillation circuit of the sensing device;
   generating an oscillation signal based on the change in capacitance;
   generating a detection signal by detecting the touch input based on a frequency included in the oscillation signal, and
   outputting a touch input detection signal.

19. The method of claim 18, wherein the capacitance is varied based on a touch occurrence that is sensed by the touch input pattern.

20. The method of claim 19, further comprising converting the oscillation signal into a count value, and generating the detection signal based on the count value.

* * * * *